(12) United States Patent
Sun

(10) Patent No.: US 6,198,617 B1
(45) Date of Patent: Mar. 6, 2001

(54) MULTI-LAYER METAL CAPACITOR

(75) Inventor: Shih-Wei Sun, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/228,853

(22) Filed: Jan. 12, 1999

(51) Int. Cl.$^7$ .................. H01G 4/30; H01G 4/20
(52) U.S. Cl. .............. 361/301.4; 361/303; 361/306.3; 361/312; 361/313; 257/303; 257/306
(58) Field of Search .................. 361/301.4, 303, 361/305, 306.1, 306.3, 311–313, 321.2, 322, 329, 328; 257/303, 306, 532; 438/240, 210, 253, 396, 241

(56) References Cited

U.S. PATENT DOCUMENTS

| | | | |
|---|---|---|---|
| 4,638,400 | * 1/1987 | Brown et al. ................ | 361/301.4 |
| 4,742,018 | * 5/1988 | Kimura et al. ................ | 257/306 |
| 5,479,316 | * 12/1995 | Smrtic et al. ................ | 361/322 |
| 5,563,762 | * 10/1996 | Leung et al. ................ | 361/301.4 |
| 5,621,606 | * 4/1997 | Hwang ................ | 361/321.4 |
| 5,801,399 | * 9/1998 | Hattori et al. ................ | 257/69 |
| 5,838,032 | * 11/1998 | Ting ................ | 257/211 |
| 6,040,616 | * 3/2000 | Dennis et al. ................ | 257/535 |

* cited by examiner

Primary Examiner—Anthony Dinkins
(74) Attorney, Agent, or Firm—Thomas, Kayden, Horstemeyer & Risley

(57) ABSTRACT

A structure of a capacitor includes an electromigration layer, which is located on a dielectric layer and serves as a lower electrode of the capacitor. A pattered capacitor dielectric layer is located on the electromigration layer, and a patterned metallic layer is located on the capacitor dielectric layer and serves as an upper electrode of the capacitor.

4 Claims, 3 Drawing Sheets

MULTI-LAYER METAL CAPACITOR

BACKGROUND OF THE INVENTION

1. Field of Invention

The present invention relates to a structure of manufacturing a capacitor. More particularly, the present invention relates to a structure for forming a stack of multi-layer metal capacitors.

2. Description of Related Art

Most analog or mixed mode circuits in a semiconductor chip contain capacitors. At present, most capacitors are of the double-polysilicon capacitor (DPC) type as shown in FIG. 1. As shown in FIG. 1, a double-polysilicon capacitor 100 is a capacitor having an upper electrode 104 and a lower electrode 102, both fabricated from polysilicon material. There is a dielectric layer 106 between the upper electrode 104 and the lower electrode 102. N-type impurities, for example, can be doped into the polysilicon layer to increase its electrical conductivity. In general, the lower electrode 102 of the double-polysilicon capacitor 100 is connected to a ground terminal while the upper electrode 104 is connected to a negative bias voltage $V_{bias}$. Hence, when the capacitor 100 is being charged, holes within the polysilicon lower electrode 102 migrate to a region on the upper surface of the lower electrode due to the negative bias voltage $V_{bias}$. These holes compensate for the N-type impurities originally doped inside the polysilicon electrode 102. Consequently, a depletion region 108 is formed on the upper surface of the electrode 102, thus forming an additional dielectric layer. In other words, an additional dielectric layer is formed over the original dielectric layer 106, thereby thickening the overall dielectric layer and reducing the charge storage capacity of the capacitor. Furthermore, capacitance of the capacitor is unstable due to some minor fluctuation of the negative bias voltage $V_{bias}$ too.

In addition, the double-polysilicon capacitor is formed by providing a first polysilicon layer, and then depositing a dielectric layer over the first polysilicon layer. Finally, one more polysilicon deposition process has to be carried out. The entire fabrication process is long and involves many steps. Moreover, conventional capacitor structure tends to occupy a larger chip area, thereby compromising the effort to increase the level of integration through a reduction in device dimensions.

In light of the foregoing, there is a need to provide an improved capacitor structure.

SUMMARY OF THE INVENTION

Accordingly, the purpose of the present invention is to provide a structure of a capacitor capable of preventing a reduction in storage capacity due to a thickening of the dielectric layer when bias voltage is applied to the capacitor during operation.

In another aspect, the purpose of the invention is to provide a simpler method of forming the capacitor, which method is capable of shortening processing time and reducing production cost. Furthermore, the capacitor formed by this method has a structure that occupies less space, and thereby is capable of increasing the level of device integration.

To achieve these and other advantages and in accordance with the purpose of the invention, as embodied and broadly described herein, the invention provides a structure of a capacitor includes an electromigration layer, which is located on a dielectric layer and serves as a lower electrode of the capacitor. A patterned capacitor dielectric layer is located on the electromigration layer, and a patterned metallic layer is located on the capacitor dielectric layer and serves as an upper electrode of the capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
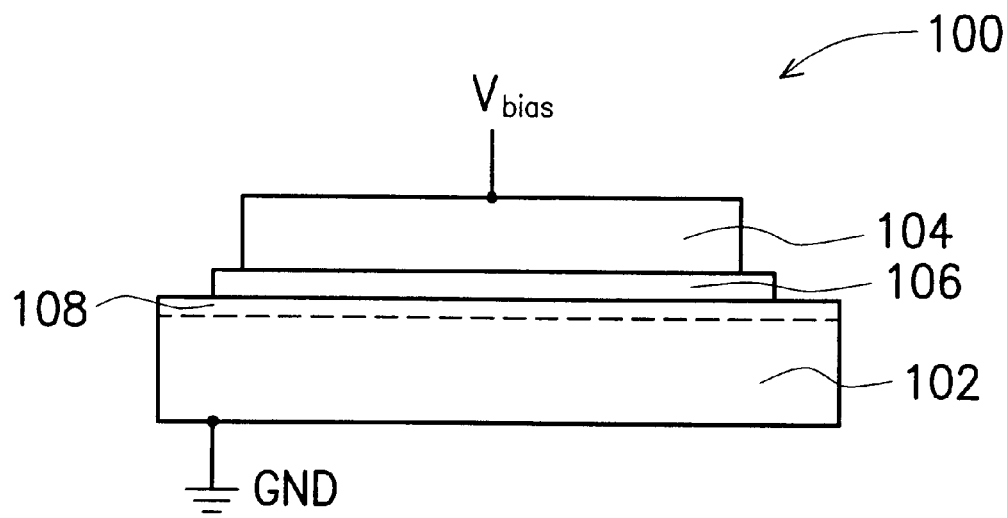
FIG. 1 is a schematic, cross-sectional view of a conventional double-polysilicon type of capacitor.

Reference will now be made in detail to the present preferred embodiments of the invention, examples of which are illustrated in the accompanying drawings. Wherever possible, the same reference numbers are used in the drawings and the description to refer to the same or like parts.

A conventional capacitor generally uses polysilicon to form the upper and the lower electrode. However, a depletion region can easily form on the upper surface of the polysilicon lower electrode leading to the thickening of the dielectric layer of a capacitor. Hence, the charge storage capacity is reduced. In this invention, a metal-insulator-metal (MIM) type of capacitor structure is formed. Therefore, no depletion region forms on the lower electrode and hence thickening of the dielectric layer is avoided.

Figure 2:
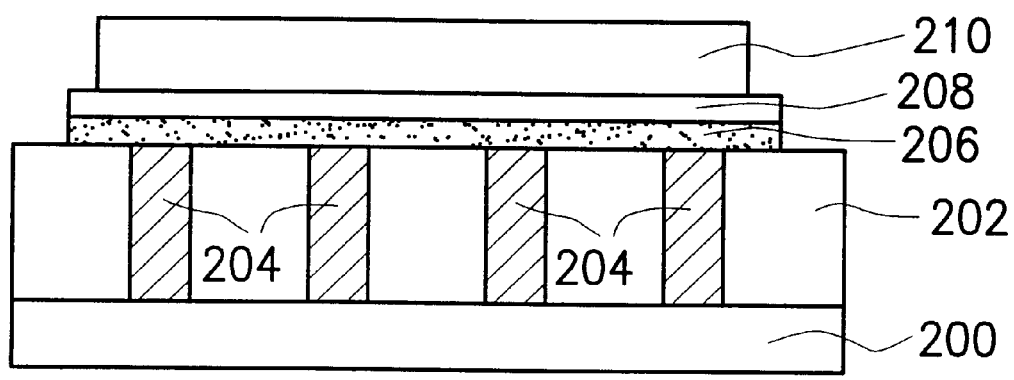
FIG. 2 is a schematic, cross-sectional view showing a metallic capacitor according to a first preferred embodiment of this invention.

FIG. 2 is a cross-sectional view showing a multi-layer metallic capacitor according to a first preferred embodiment of this invention. As shown in FIG. 2, a dielectric layer 202 is formed over a substrate 200 or an active region. Thereafter, the dielectric layer 202 is planarized by performing a chemical-mechanical polishing (CMP) operation. Next, photolithographic and etching processes are carried out to form a contact opening, and then conductive material is deposited into the contact opening to form a contact 204. Before fabricating interconnects, an electromigration layer 206 is formed over the dielectric layer 202 so that the electromigration of the metallic interconnects can be avoided. The electromigration layer 206 can be a titanium/titanium nitride layer formed by sputtering, for example. Next, a dielectric layer 208 is formed over the electromigration layer 206, and then patterned according to the layout design. Thereafter, a metallic layer 210 is formed over the dielectric layer 208, and then patterned to form an upper electrode of the capacitor. The metallic layer 210 can be an aluminum/copper alloy. Alternatively, the metallic layer 210 can be an anti-reflective coating (ARC) that includes a titanium/titanium nitride composite layer. Since the etchant for etching the metallic layer 210 also can etch the electromigration layer 206, the electromigration layer 206 covered by the dielectric layer 208 is then self-alignedly patterned and serves as a lower electrode of the capacitor.

Figure 3A:
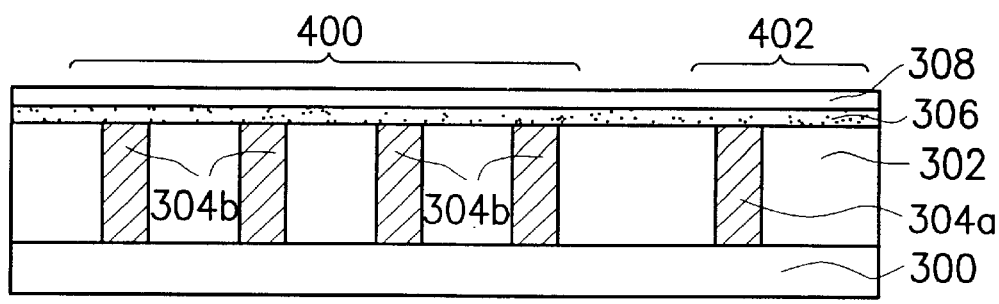
FIGS. 3A–3D are schematic, cross-sectional views illustrating fabrication of a metallic capacitor according to a second preferred embodiment of this invention.
Figure 3B:
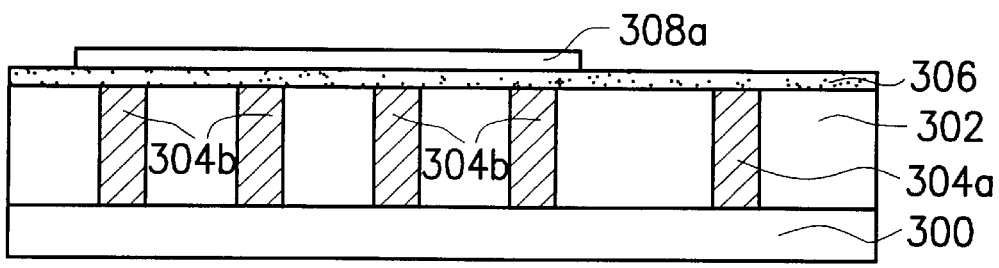

Since the conventional method of fabricating a capacitor is complicated and the capacitor can occupy a rather large area, the ultimate level of device integration is quite limited. This invention also provides a second embodiment that incorporates processing steps similar to the one shown in FIG. 2 with the fabrication of a contact/via. FIGS. 3A–3D are schematic, cross-sectional views showing fabrication of a metallic capacitor according to a second preferred embodiment of this invention. As shown in FIG. 3A, the method of forming a metallic capacitor includes forming a dielectric layer 302 over a substrate 300 with a capacitor area 400 and a via area 402. Contacts 304a, 304b are respectively formed within the dielectric layer 302 in the capacitor area 400 and the via area 402. A metallic layer 306 and a dielectric layer 308 are successively formed over the substrate 300. The metallic layer 306 can be a titanium nitride and the dielectric layer 308 includes NO, $Ta_2O_5$ or BST. The dielectric layer 308 is then patterned by photolithography according to the layout design and a capacitor dielectric layer 308a is thus formed on the metallic layer 306 in the capacitor area 400, as shown in FIG. 3B.

Figure 3C:
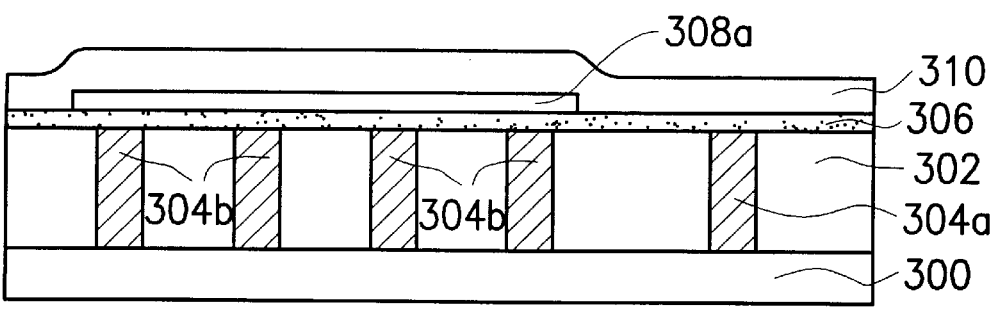
Figure 3D:
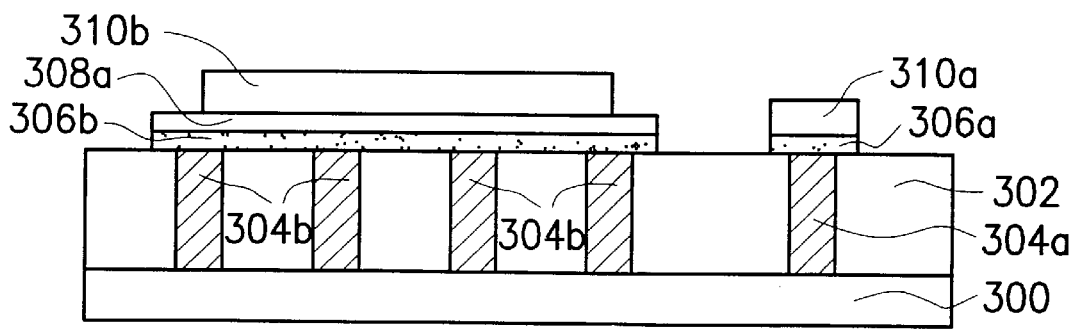

Referring to FIG. 3C, a metallic layer 310 is formed on the capacitor dielectric layer 308a and the metallic layer 306. The metallic layer 310, for example, can be an aluminum/copper alloy layer or an anti-reflection coating containing titanium/titanium nitride. After patterning the metallic layer 310 as shown in FIG. 3C, metallic layers 310a, 310b are formed on the metallic layer 306 in the via area 402 and the capacitor area 400, respectively, and the metallic layer 306 is self-alignedly patterned to form metallic layers 306b, 306a in FIG. 3D since the metallic layers 306, 310 can be etched by the same etchant. Therefore, the metallic layer 310b is formed over the capacitor dielectric layer 308a to serve as the upper electrode of the capacitor, and the metallic layer 308a is formed on the dielectric layer 302 to serve as the lower electrode of the capacitor. The metallic layers 306a, 310a in the via area become an electromigration layer and part of the interconnects.

Figure 4:
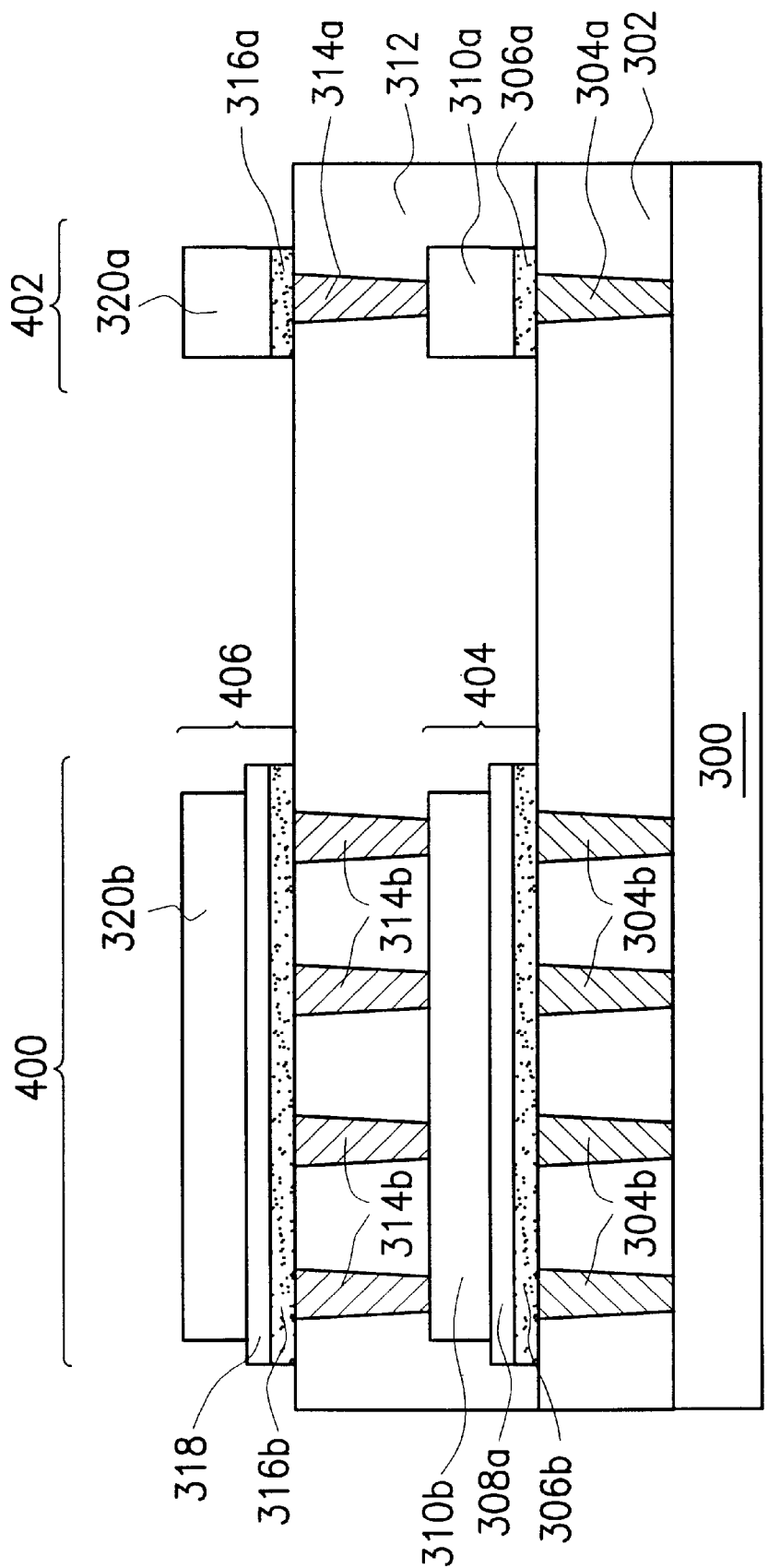
FIG. 4 is a schematic, cross-sectional view showing a stack of multi-layer metallic capacitors according to a second preferred embodiment of this invention.

The foregoing processes as described above can be repeatedly performed to form a stack of multi-layer metallic capacitors as illustrated in FIG. 4. A substrate 300 has a capacitor area 400 and a via area 402, and a dielectric layer 302 containing contacts 304a, 304b is formed thereon. According to the processes illustrated in FIGS. 3A–3D, capacitors 404, 406 are therefore formed in the capacitor area 400 over the dielectric layer 302. The capacitor 404 includes a lower electrode 306b, a capacitor dielectric layer 308a and an upper electrode layer 310b. The metallic layers 306b, 310b, which are simultaneously formed with the lower electrode 306a and the upper electrode 310a, are used as a part of the electromigration layer and the interconnects. A dielectric layer 312 is formed on the upper electrode 310b and the metallic layer 310a, and vias 314b, 314a are formed within the dielectric layer 312 in the capacitor area 400 and the via area 402, respectively. With respect to the processes illustrated in FIGS. 3A–3D, a lower electrode 316b, a capacitor dielectric layer 318 and an upper electrode 320b of the capacitor 406 are formed on the dielectric layer 312. The metallic layer 316a, 320a in the via area 402 are also used as an electromigration layer and as part of the interconnects.

The aforementioned processing steps in FIGS. 3A–3D can be repeated many times to form a stack of multi-layer metallic capacitors.

In summary, the electromigration layer necessary for the via is self-alignedly patterned with respect to the layout design to form the lower electrode of a capacitor. After the deposition of a patterned dielectric layer over the electromigration layer, a metallic layer is deposited over the dielectric layer. Next, the metallic layer is patterned to form an upper electrode in the capacitor area while a portion of the metallic layer is patterned to become part of the via. Hence, some of the structural components in a normal fabrication in the via processes are actually re-used in this invention. Consequently, manufacturing time is shortened and some production cost is saved. Furthermore, unlike a double-polysilicon capacitor, the upper and lower electrodes in this invention are both made of metals. Hence, a depletion region does not form on the upper layer of the lower electrode and capacitance of the capacitor can be maintained. In addition, the capacitors can be stacked on top of one another just like multi-layer interconnects. Hence, space is available for accommodating the capacitor, and the level of integration can be greatly increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stacked multi-layer metallic capacitor adapted for a substrate having a first dielectric layer wherein the substrate has a capacitor area and a via area at least having a contact, comprising:

a first metallic layer, located on the dielectric layer wherein a portion of the first metallic layer serves as a lower electrode of a first capacitor and a portion of the first metallic layer located on the contact to serve as a first electromigration layer;

a first capacitor dielectric layer, located on the first metallic layer of the capacitor area;

a second metallic layer, a portion of the second metallic layer located on the first capacitor dielectric layer to serve as an upper electrode of the first capacitor and the second metallic layer on the first electromigration layer serves as a portion of an interconnect;

a second dielectric layer, located on the second metallic layer and at least having a via on the interconnect;

a third metallic layer, located on the second dielectric layer to serve as a lower electrode of a second capacitor and a portion of the third metallic layer located on the via to serve as a second electromigration layer;

a second capacitor dielectric layer, located on the third metallic layer of the capacitor area; and a forth metallic layer, a portion of the forth metallic layer located on the second capacitor dielectric layer to serve as an upper electrode of the second capacitor and the forth metallic layer on the second electromigration layer serves as a portion of the interconnect.

2. The stacked multi-layer metallic capacitor of claim 1, wherein the first metallic layer includes a titanium/titanium nitride composite layer.

3. The stacked multi-layer metallic capacitor of claim 1, wherein the second metallic layer includes an aluminum/copper alloy layer.

4. The stacked multi-layer metallic capacitor of claim 1, wherein the second metallic layer includes an anti-reflection layer.

* * * * *